(12) United States Patent
Asami et al.

(10) Patent No.: US 7,220,613 B2
(45) Date of Patent: May 22, 2007

(54) MANUFACTURING METHOD FOR SEMICONDUCTOR DEVICE

(75) Inventors: Taketomi Asami, Atsugi (JP); Mitsuhiro Ichijo, Atsugi (JP); Satoshi Toriumi, Atsugi (JP); Takashi Ohtsuki, Atsugi (JP); Shunpei Yamazaki, Setagaya (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 118 days.

(21) Appl. No.: 10/928,271

(22) Filed: Aug. 30, 2004

(65) Prior Publication Data
US 2005/0026320 A1 Feb. 3, 2005

Related U.S. Application Data

(62) Division of application No. 09/842,315, filed on Apr. 26, 2001, now Pat. No. 6,794,229.

(30) Foreign Application Priority Data
Apr. 28, 2000 (JP) ............................. 2000-131353

(51) Int. Cl.
*H01L 33/00* (2006.01)

(52) U.S. Cl. ................. 438/34; 257/E33.053

(58) Field of Classification Search ............ 438/225, 438/34, 35, 38, 155, 481; 257/E33.004, 257/E33.043, E33.053, E21.224
See application file for complete search history.

(56) References Cited

U.S. PATENT DOCUMENTS

| 5,181,985 | A | | 1/1993 | Lampert et al. |
|---|---|---|---|---|
| 5,294,570 | A | | 3/1994 | Fleming, Jr. et al. |
| 5,317,169 | A | * | 5/1994 | Nakano et al. ............... 257/40 |
| 5,505,985 | A | * | 4/1996 | Nakamura et al. ............ 427/66 |
| 5,712,198 | A | | 1/1998 | Shive et al. |
| 5,726,457 | A | * | 3/1998 | Nakano et al. ............... 257/40 |
| 5,773,325 | A | | 6/1998 | Teramoto |
| 5,879,969 | A | | 3/1999 | Yamazaki et al. |
| 6,016,033 | A | * | 1/2000 | Jones et al. .................. 313/506 |
| 6,177,302 | B1 | | 1/2001 | Yamazaki et al. |
| 6,221,766 | B1 | | 4/2001 | Wasserman |
| 6,228,751 | B1 | | 5/2001 | Yamazaki et al. |
| 6,277,657 | B1 | | 8/2001 | Nozawa et al. |
| 6,313,017 | B1 | | 11/2001 | Varhue |
| 6,426,288 | B1 | | 7/2002 | Meikle |
| 6,433,487 | B1 | * | 8/2002 | Yamazaki ................ 315/169.3 |
| 6,982,462 | B2 | * | 1/2006 | Koyama ..................... 257/350 |
| 2002/0063169 | A1 | | 5/2002 | Verhaverbeke et al. |

OTHER PUBLICATIONS

Stanley Wolf, "Silicon Processing for the VSLI Era," vol. 1, Lattice Press, 1986, p. 516.

* cited by examiner

*Primary Examiner*—Carl Whitehead, Jr.
*Assistant Examiner*—Jennifer M. Dolan
(74) *Attorney, Agent, or Firm*—Eric J. Robinson; Robinson Intellectual Property Law Office, P.C.

(57) ABSTRACT

The present invention is provided in order to remove contamination due to contaminant impurities of the interfaces of each film which forms a TFT, which is the major factor that reduces the reliability of TFTs. By connecting a washing chamber and a film formation chamber, film formation can be carried out without exposing TFTs to the air during the time from washing step to the film formation step and it becomes possible to maintain the cleanliness of the interfaces of each film which form the TFT.

16 Claims, 12 Drawing Sheets

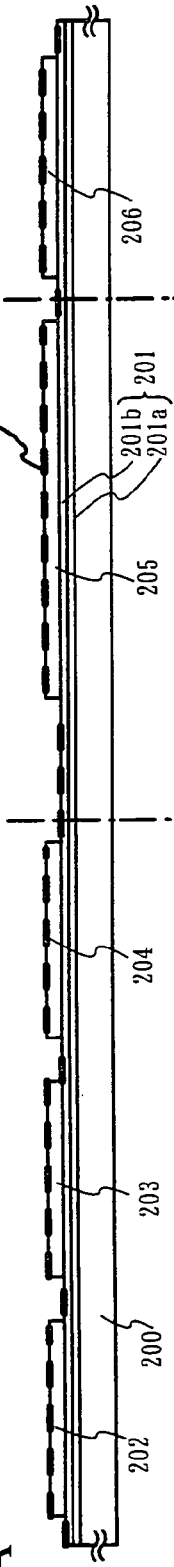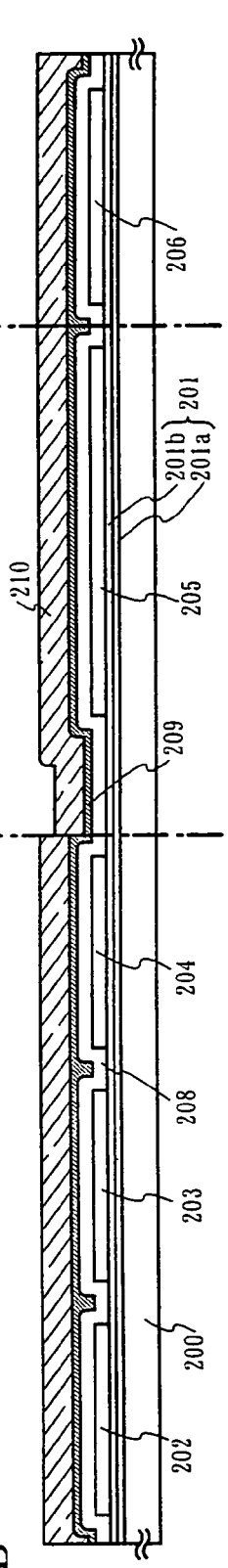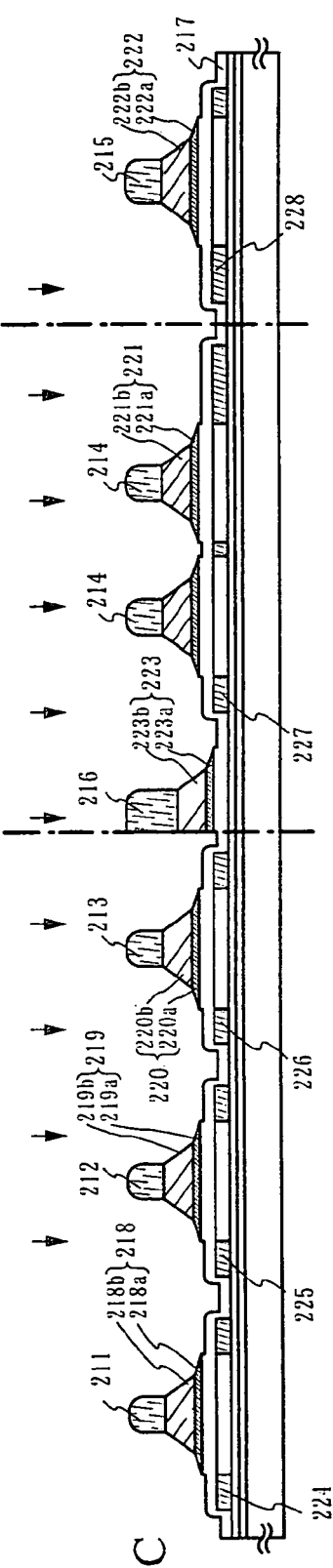

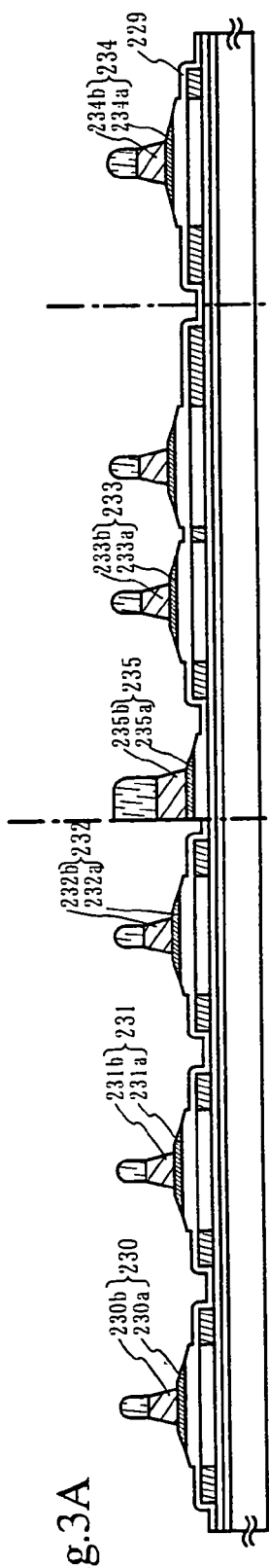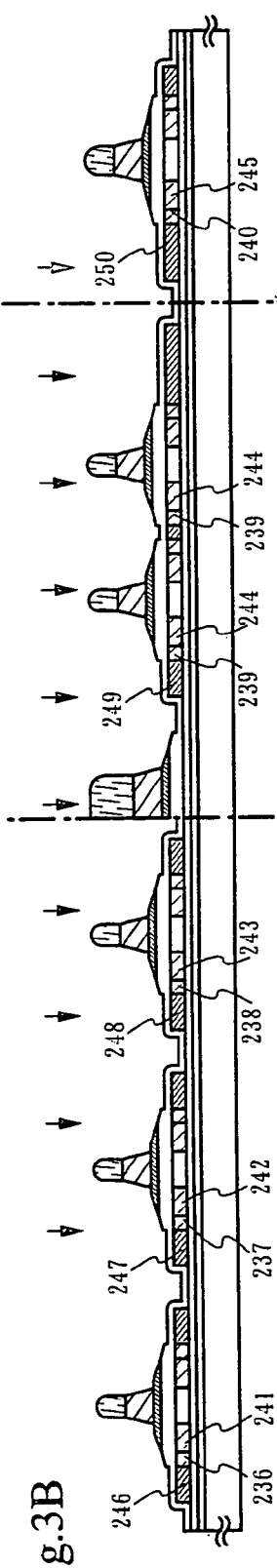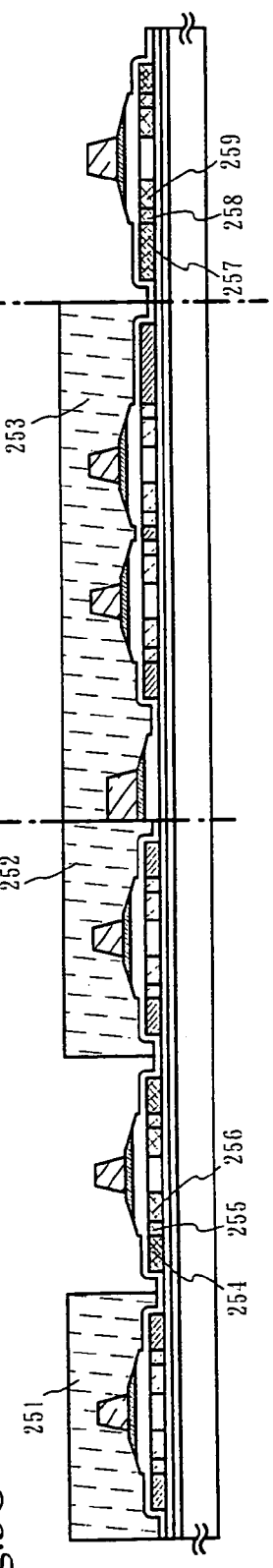

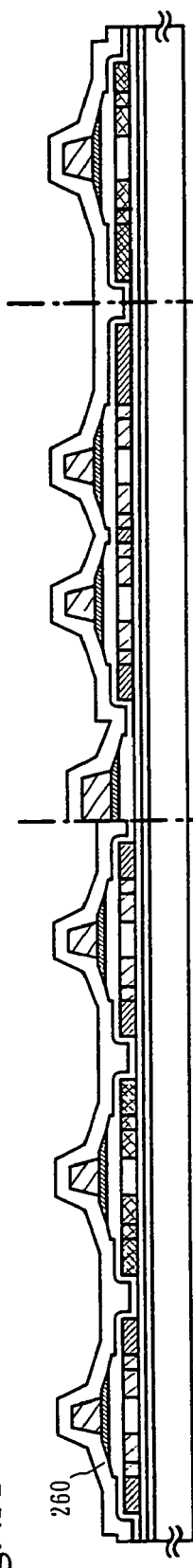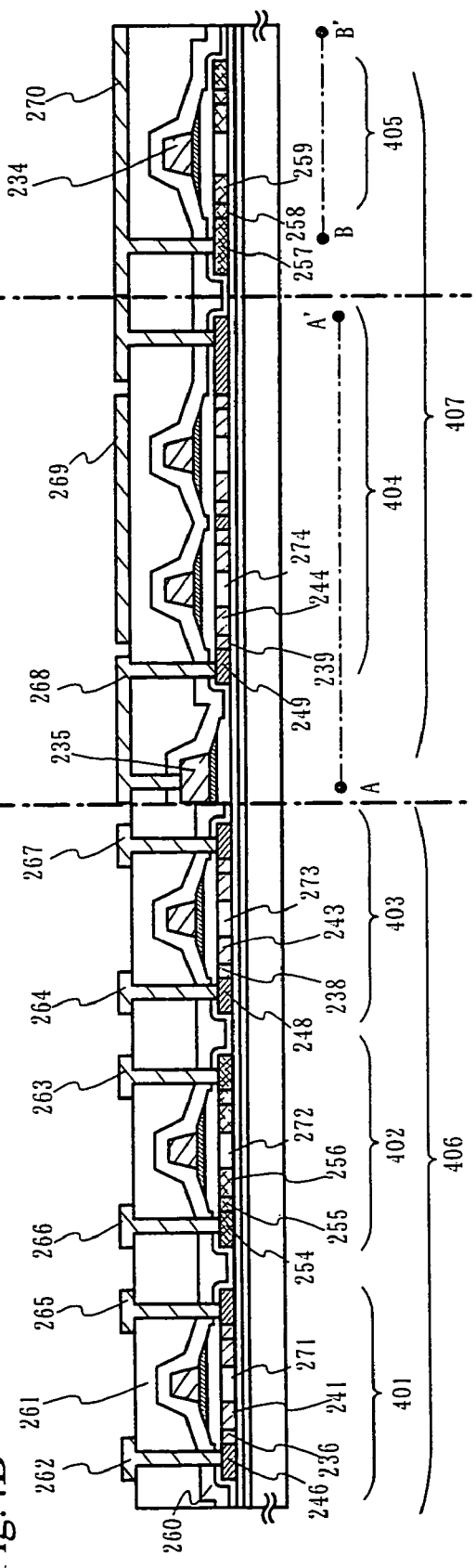
Fig.4A
Fig.4B

MANUFACTURING METHOD FOR SEMICONDUCTOR DEVICE

BACKGROUND OF THE INVENTION

1. Field of the Invention

The present invention relates to a semiconductor device such as a thin film transistor (hereinafter referred to as TFT) which is formed on a substrate using a crystalline semiconductor film as well as to a manufacturing method of the same. The semiconductor device of the present invention includes not only elements such as TFT and MOS transistor, but also a liquid crystal display device comprising a semiconductor circuit (micro-processor, signal processing circuit and high frequency circuit and the like) constructed of the above insulation gate type transistors, an EL (Electro Luminescence) display device, an EC (Electro Chromic) display device and an image sensor and the like.

2. Description of the Prior Art

At present, as a semiconductor element using a semiconductor film, a thin film transistor (hereinafter, referred to as TFT) is used in a variety of integrated circuits, in particular, as a switching element of an image display device. In addition, a TFT using a crystalline semiconductor film, of which the mobility is higher than that of an amorphous semiconductor film, as an active layer has a high driving performance and is used as an element of a driving circuit.

Reliability is seen as the most important factor in evaluating a TFT. As for a factor that decreases reliability, impurities in a TFT (hereinafter, impurities which lower the reliability of a TFT are referred to as contaminant impurities in the present specification) are cited. These contaminant impurities become mixed into a TFT from a variety of contamination sources, such as an atmosphere, a glass substrate or a manufacturing device, etc. In particular, the existence of contaminant impurities on the interfaces of a film forming a TFT becomes a major factor that decreases the reliability of the TFT.

SUMMARY OF THE INVENTION

A semiconductor device is usually produced in a clean room. In a clean room, filters are used for removing dirt, dust, contaminants, or the like from the outside air which is taken into the room. Contaminant impurities generated from the filters themselves, particularly boron (B), or contaminant impurities from human beings working in the clean room, particularly sodium (Na), exist in large amounts in the clean room atmosphere. That is to say, by merely exposing a substrate to the atmosphere of the clean room, the surface of the substrate gets contaminated.

Most of the steps of forming a variety of films which form a TFT, however, cannot be carried out in a sequential process. For example, a crystalline semiconductor film is obtained by using a method which crystallizes an amorphous semiconductor film with heat, laser light, or the like. Crystallization of the amorphous semiconductor film with annealing becomes difficult in the case that an insulating film lies on the amorphous semiconductor film and, therefore, the crystallization is carried out under the condition where no insulating film exists on the semiconductor film. Accordingly, it is necessary to wash the surface of the semiconductor film before the formation of the insulating film. That is to say, the step of washing the surface of the first film before the formation of the second film becomes necessary. During the time before being put into a film formation unit from a washer, however, a substrate is exposed to the atmosphere.

The present invention is provided for maintaining the clean condition of an interface of each film forming a TFT without being contaminated by contaminant impurities.

In order to solve the above described problem, the present invention provides a washing chamber for removing contaminant impurities from the surface of the first film with the film formation unit via a loader/unloader chamber, and is characterized by the sequential processing from the removal of contaminant impurities from the surface of the first film, to the formation of the second film. In other words, the present invention is characterized in that, since the step of washing the surface of the first film and the step of forming the second film are processed in sequence within one unit, the above steps are processed without exposure to the atmosphere including the interval between them.

In the above described configuration, the removal of contaminant impurities from the surface of the first film is carried out by etching the surface of the first film extremely thin using an acid solution which includes fluorine, after carrying out the washing with pure water in which ozone is dissolved. As for the means of etching extremely thin, there is an effective method of spinning the substrate using a spinning device so as to make the acid solution, which includes fluorine and is in contact with the surface of the first film, fly off in the air in all directions.

The reasons why the above pure water, in which ozone is dissolved, is used are cited as follows:

(1) An extremely thin oxide film is formed on the surface of the first film by means of ozone so that contaminant impurities adhered to the surface of said first film can be removed together with said extremely thin oxide film by using the subsequent acid solution which includes fluorine.

(2) In the case that the first film is hydrophobic, by oxidizing the surface thereof with ozone, the surface of the first film is converted to be hydrophilic so that the effects of washing increase.

(3) A microscopic amount of a carbonized substance which may exist in the clean room atmosphere can be removed through ozone oxidation and the resulting resolution.

As for the acid solution which includes fluorine, fluorine acid, dilute fluoric acid, ammonium fluoride, buffered fluoric acid (mixed solution of fluoric acid and ammonium fluoride), a mixed solution of fluoric acid and hydrogen peroxide, or the like, can be used.

Accordingly, a semiconductor device of the present invention is characterized in that contaminant impurities of the surface of each film forming a TFT are removed by providing a spinning type washer in the washing chamber and by using pure water in which ozone is dissolved, and an acid solution containing fluorine, as a washing liquid.

In accordance with the present invention, contamination, due to contact with air, of the interfaces of the films which form TFTs can be prevented and, therefore, dispersion of the characteristics of the TFTs can be reduced so that the reliability of the TFTs can be increased. In addition, the instability of the display of an EL display device, which is greatly affected by the dispersion of the characteristics of the TFTs because of current drive, can be reduced.

BRIEF DESCRIPTION OF THE DRAWINGS

FIGS. 2A, 2B, and 2C are cross sectional views of a TFT according to the example 1;

FIGS. 3A, 3B, and 3C are cross sectional views of a TFT according to the example 1;

FIGS. 4A and 4B are cross sectional views of a TFT according to the example 1;

DESCRIPTION OF THE PREFERRED EMBODIMENTS

An embodiment mode of the present invention is described in the following with reference to FIG. 1. In addition, the present invention can, of course, be applied to a film formation unit wherein there is a single film formation chamber or to a film formation unit wherein a plurality of film formation chambers are aligned along a line.

Figure 1:
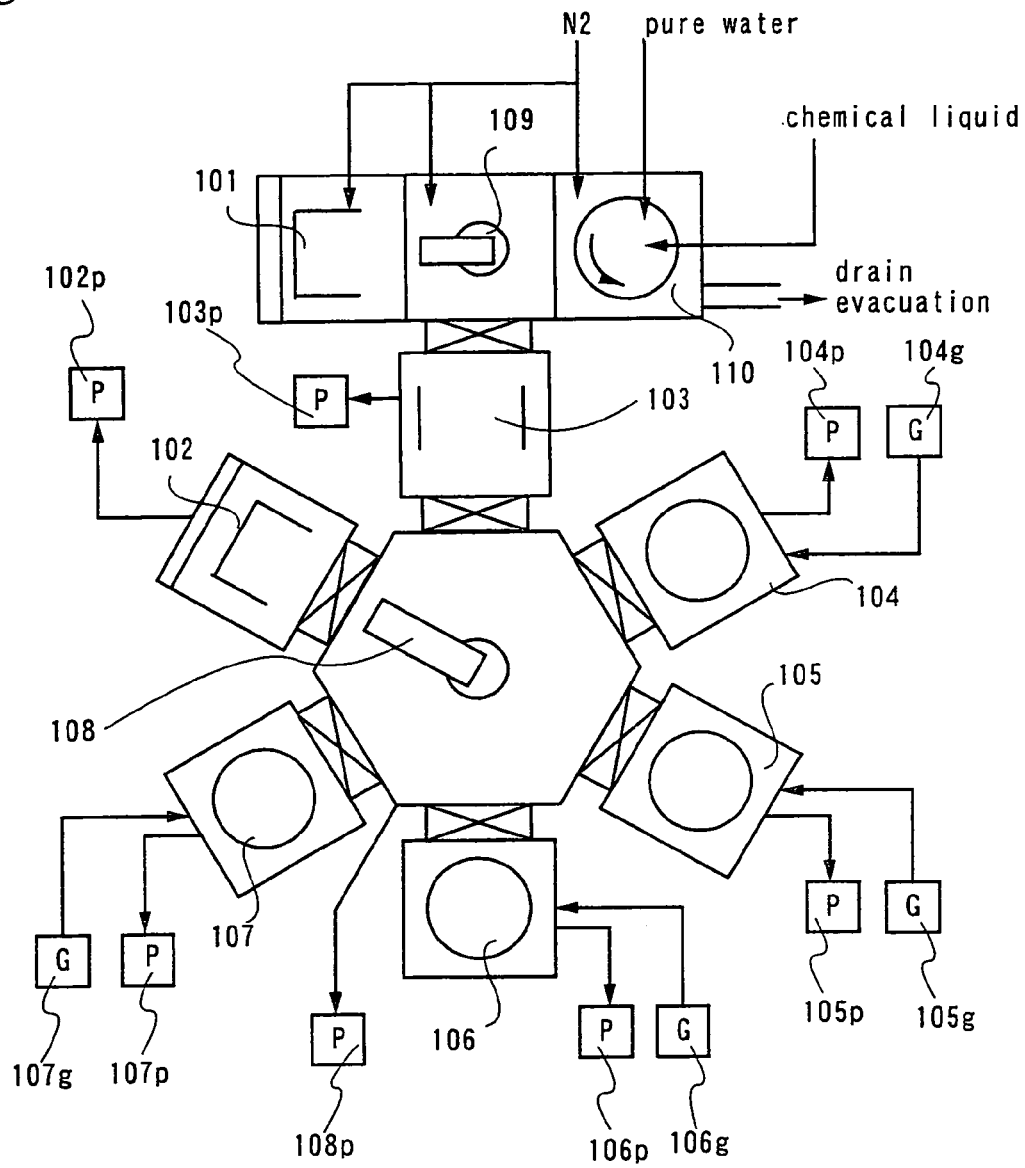
FIG. 1 is a view of a film formation unit which includes a washer.

In FIG. 1, substrates set in a loader/unloader chamber 101 are carried into a washing chamber 110 one by one by a carrier robot 109 and the washing process is performed. Substrates after the washing process are carried by the carrier robot 109 into a loader/unloader chamber 103 provided between the washing chamber and a film formation chamber. When it is completed to collect all of the substrates after completing the washing process, the loader/unloader chamber 103 is vacuumed. Then, the substrates are carried into any of the film formation chambers 104 to 107 by a carrier robot 108 and necessary films are formed. Substrates are collected in a loader/unloader chamber 102 after finishing the film formations.

In the film formation chambers 104 to 107, gas exhaustion means 104$p$ to 107$p$ and gas introduction means 104$g$ to 107$g$ are respectively provided and the film formations of semiconductor films, insulating films and conductive films are carried out.

Here, the washing chamber 110 is purged with $N_2$ so as to prevent the mixing in of contaminants from the atmosphere.

In addition, the loader/unloader chamber 103 is vacuumed after completing washing all of the processed substrates because the washing chamber is subject to atmospheric pressure while the film formation chamber is under the condition of reduced pressure.

Films in the present configuration indicate films formed by using a variety of formation means such as a plasma CVD method, a thermal CVD method, a reduced pressure CVD method, a vapor deposition method, a sputtering method, a thermal oxidation method and a positive electrode oxidation method.

In addition, contaminant impurities in the present configuration consist of one element, or a plurality of elements, existing in the atmosphere, and in particular, consist of one element or a plurality of elements, selected from among B, Na, K, Mg and Ca.

Although examples of the present invention are shown in the following, the present invention is not particularly limited to these.

EXAMPLES

Example 1

Examples of the present invention are described with reference to FIGS. 2 to 6. Here, a method for simultaneously manufacturing a pixel portion and TFTs (n channel type TFTs and p channel type TFTs) of a driving circuit provided around the periphery of the pixel portion on the same substrate is described in detail.

As for a substrate 200, a glass substrate, a quartz substrate, a ceramic substrate, or the like, can be used. In addition, a substrate obtained by forming an insulating film on the surface of a silicon substrate, a metal substrate or a stainless substrate may be used. Moreover, a plastic substrate, which has sufficient heat resistance to withstand the processing temperature in the present example, may be used.

Next, as shown in FIG. 2A, a base film 201 made of an insulating film, such as a silicon oxide film, a silicon nitride film or a silicon oxide nitride film, is formed on the substrate 200. Though a double-layered structure is used for the base film 201 in the present example, a single layered film of said insulating film, or a structure where two or more layers are laminated, may be used. As for the first layer of the base film 201, a silicon oxide nitride film 201$a$ of 50 nm to 100 nm, which is formed by using a plasma CVD method with $SiH_4$, $NH_3$ and $N_2O$ as reactive gases, is formed. Then, as for the second layer of the base film 201, a silicon oxide nitride film 201$b$ of the thickness of 100 nm to 150 nm, which is formed by using a plasma CVD method with $SiH_4$ and $N_2O$ as reactive gases, is laminated.

Next, semiconductor layers 202 to 206 are formed on the base film. After the formation of a semiconductor film with an amorphous structure by a well-known means (sputtering method, LPCVD method or plasma CVD method), the semiconductor layers 202 to 206 are formed by patterning the crystalline semiconductor film, which is obtained by carrying out a well-known crystallization process (laser crystallization method, thermal crystallization method, thermal crystallization method using a catalyst such as nickel, or the like), into the desired form. This semiconductor layers, 202 to 206, are formed to have the thickness of 30 nm to 60 nm. Though there are no particular limitations as to the materials of the crystalline semiconductor film, it is, preferably, formed of silicon, silicon germanium alloy (SiGe), or the like.

In addition, since it is possible to form the base film 201 and the amorphous semiconductor film by the same film formation method, it is desirable to form the base film 201 and the amorphous semiconductor film in sequence. For example, in the film formation unit of FIG. 1, a substrate is preheated in the heating chamber 104, the base film 201$a$ is formed in the first film formation chamber 105, then the base film 201$b$ is formed in the second film formation chamber 106 and, finally, the film formation of the amorphous semiconductor film is carried out in the third film formation chamber 107. As a result, impurity contamination of the film interfaces can be prevented so as to reduce one factor that causes deterioration to the characteristics of the TFT.

In addition, after the formation of the semiconductor layer 202 to 206, doping of a microscopic amount of impurity elements (boron or phosphorous) may be carried out in order to control the threshold of the TFTs.

Next, the sequential process of the removal of the contaminant impurities 207 which exist on the surface of the island-shaped semiconductor layer 202 to 206, and the formation of a gate insulating film 208 is carried out. Substrates are set in the loader/unloader chamber 101 of the unit shown in FIG. 1 and are, one by one, subjected to a spinning wash process in the washing chamber 110. Here, by using pure water in which ozone is dissolved, and an acid solution containing fluorine, the contaminant impurities 207 can be removed together with an extremely thin oxide film formed in washing with pure water in which ozone is dissolved. As for preparation of the pure water in which ozone is dissolved, there are methods of electrically resolving pure water, of directly dissolving ozone gas into pure water, or the like. In addition, the water is utilized at, preferably, an ozone concentration of 6 mg/L or more. Here, as for the number of revolution of the spinning device or the time conditions, the optimal conditions may be properly set according to the substrate area, the film material, and the like. After completion of the washing process, substrates are collected in the loader/unloader chamber 103 which is provided between the washing chamber and the film formation chamber. When all of the substrates are collected, the loader/unloader chamber 103 is vacuumed.

After that, the gate insulating film 208 is formed in the film formation chambers 104 to 107. The gate insulating film 208 is formed through a plasma CVD method or a sputtering method and is formed of an insulating film which includes silicon, and the thickness thereof is made to be 40 nm to 150 nm. After completing the film formation, the substrates are collected in the loader/unloader chamber 102. The gate insulating film is not limited to a silicon oxide nitride film and, a single layer or a layered structure, of another insulating film which includes silicon, may be used.

Next, the sequential process of the removal of contaminant impurities existing on the surface of the gate insulating film 208 and of the formation of a gate conductive film is carried out. In the present example, a first conductive film (TaN) 209 of the film thickness of 20 nm to 100 nm and a second conductive film (W) 210 of the film thickness of 100 nm to 400 nm are laminated. The gate conductive films may be formed of an element selected from among Ta, W, Ti, Mo, Al, Cu or of an alloy material, or a compound material, of which the major component is the above element. In addition, a semiconductor film represented by a polycrystal silicon film, into which impurity elements such as phosphorous are doped, may be used. Moreover, a combination wherein the first conductive film is formed of a Ta film and the second conductive film is made of a W film, a combination wherein the first conductive film is formed of a TaN film and the second conductive film is formed of an Al film, or a combination wherein the first conductive film is formed of a TaN film and the second conductive film is made of a Cu film, may be used.

Here, in the case that the sequential formations of the gate insulating film 208 and the gate conductive films 209 and 210 are carried out, the above described washing step can be omitted.

Next, masks 211 to 216 made of resist is formed by using a photolithographic method and the first etching process is carried out for forming electrodes and wirings. In the present example an ICP (inductively coupled plasma) etching method is used and $CF_4$, $Cl_2$ and $O_2$ are used as gases for etching so that the gas flow ratio of respective gases is made to be 25/25/10 (sccm) and, then, the etching is carried out by applying an RF (13.56 MHz) power of 500 W to a coil type electrode under the pressure of 1 Pa so as to generate plasma. An RF (13.56 MHz) power of 150 W is applied to the substrate side (sample stage) so that a substantially negative self-biasing voltage is applied. The W film is etched under this first etching condition so that the edges of the first conductive layer become of a tapered form.

Thereafter, the etching condition is converted to the second etching condition without removing the mask 211 to 216 made of the resist, $CF_4$ and $Cl_2$ are used as the gases for etching so that the gas flow ratio of respective gases is made to be 30/30 (sccm) and, then, an RF (13.56 MHz) power of 500 W is applied to a coil type electrode under the pressure of 1 Pa so as to generate plasma and etching is carried out for approximately 30 seconds. An RF (13.56 MHz) power of 20 W is applied to the substrate side (sample stage) so that a substantially negative self-biasing voltage is applied. Under the second etching condition wherein $CF_4$ and $Cl_2$ are mixed, the W film and the TaN film are etched to the same degree. Here, in order to carry out the etching without leaving a residue on the gate insulating film, the etching time may be increased by the ratio of approximately 10% to 20%.

In the above described first etching process, by making the form of the masks made of the resist suitable, the edges of the first conductive layer and the second conductive layer become of a tapered form due to the effect of the biased voltage applied to the substrate side. The angle of these tapered portions becomes 15° to 45°. Thus, the conductive layers 218 to 223 in a first form made of the first conductive layer and the second conductive layer (first conductive layer 218a to 223a and second conductive layer 218b to 223b) are formed through the first etching process. The gate insulating film is denoted as 217 and the regions which are not covered with the conductive layer 218 to 223 in the first form are etched by approximately 20 nm to 50 nm so that thinner regions are formed.

Then, the first doping process is carried out without removing the masks made of the resist so that impurity elements are added to the semiconductor layer (FIG. 2(C)), which is converted to the n type. As for the doping process, an ion doping method or an ion injection method may be carried out. As for the conditions of the ion doping method, the dosage is $1 \times 10^{13}$ atoms/cm$^2$ to $5 \times 10^{15}$ atoms/cm$^2$ and acceleration voltage is 60 keV to 100 keV. As for the impurity elements which convert the semiconductor layer into the n type, elements which belong to group 15, typically phosphorous (P) or arsenic (As), are used. In this case, the conductive layers 218 to 222 work as masks against the impurity elements, which convert the semiconductor layer into the n type, so that the first impurity regions 224 to 228 are formed in a self-aligned manner. The impurity elements which convert the semiconductor layer into the n type are added in the concentration ranging from $1 \times 10^{20}$ atoms/cm$^3$ to $1 \times 10^{21}$ atoms/cm$^3$ into the first impurity regions 224 to 228.

Next, the second etching process is carried out without removing the masks made of the resist as shown in FIG. 3A. The second etching process is carried out under the third and the fourth etching conditions. As for the third etching condition, an ICP etching method is used in the same manner, wherein $CF_4$ and $Cl_2$ are used as the etching gases so that the gas flow ratio of the respective gases is made to be 30/30 (sccm), an RF power (13.56 MHz) of 500 W is supplied to the coil type electrode under the pressure of 1 Pa so as to generate plasma, and the etching is carried out for approximately 60 seconds. An RF (13.56 MHz) power of 20 W is given to the substrate side (sample stage) so that a self-biasing voltage which is lower than that in the first etching process is applied. Under the third etching condition in which $CF_4$ and $C_2$ are mixed, the W film and the TaN film are etched to the same degree.

Thereafter, the etching condition is converted to the fourth etching condition without removing the masks made of the resist, in which $CF_4$, $Cl_2$ and $O_2$ are used for the gases for the etching so that the gas flow ratio of the respective gases is made to be 25/25/10 (sccm), an RF (13.56 MHz) power of 500 W is applied to the coil type electrode under the pressure of 1 Pa so as to generate plasma, and the etching is carried out for approximately 20 seconds. An RF (13.56 MHz) power of 20 W is given to the substrate side (sample stage) so that a self-biasing voltage which is lower than that in the first etching process is applied. Under this fourth etching condition, the W film is etched.

Thus, the W film is etched in an anisotropic manner under the above described third and fourth etching conditions and the TaN film is etched in an anisotropic manner with a slower etching rate than that of the W film so as to form the conductive layers 230 to 235 in the second form (first conductive layer 230a to 235a and second conductive layer 230b to 235b). The gate insulating film is denoted as 229 and the regions which are not covered with the conductive layer 230 to 235 in the second form are etched to become thinner by the film thickness of approximately 10 nm to 20 nm.

The etching reaction with the mixed gas of $CF_4$ and $Cl_2$ to the W film or the TaN film can be estimated from types of generated radicals or ions and vapor pressure of products after the reaction. Comparing the vapor pressures of the fluorides and chlorides of W and TaN, $WF_6$, which is a fluoride of W, is extremely high and the others, $WCl_5$, $TaF_5$ and $TaCl_5$, are approximately the same. Accordingly, both the W film and the TaN film are etched with the mixed gas of $CF_4$ and $Cl_2$. When a proper amount of $O_2$ is added to this mixed gas, however, $CF_4$ and $O_2$ react to become CO and F so as to generate a large amount of F radicals or F ions. As a result, the etching rate of the W film increases since vapor pressure of the fluoride is high. On the other hand, the increase of the etching rate for TaN is comparatively small even when F increases. In addition, TaN can be more easily oxidized compared to W and, therefore, the addition of $O_2$ causes a slight oxidization of the surface of TaN. Since the oxides of TaN do not react with fluorine or chlorine, the etching rate of the TaN film is further reduced. Accordingly, it becomes possible to make a difference between the etching rates of the W film and the TaN film and it becomes possible to make the etching rate of the W film be greater than that of the TaN film.

Next, the second doping process is carried out without removing the masks made of the resist as shown in FIG. 3B. In this case, impurity elements which convert the semiconductor layer into the n type are doped under the condition of a high acceleration voltage with making the dosage lower than in the first doping process. For example, the acceleration voltage is 70 keV to 120 keV. In the present example the acceleration voltage is 90 keV and the dosage is $3.5 \times 10^{12}$ atoms/cm$^2$ so as to form new impurity regions in the semiconductor layer inside of the first impurity regions formed in FIG. 2C. As for the doping, the conductive layers 230 to 234 in the second form are used as masks against the impurity elements and the doping is carried out so that impurity elements are added to the semiconductor layer beneath the tapered portions of the second conductive layers 230a to 234a.

Thus, the third impurity regions 241 to 245 which overlap the second conductive layers 230a to 234a, and the second impurity regions 236 to 240 between the first impurity regions 246 to 250 and the third impurity regions 241 to 245, are formed. The impurity elements which convert the semiconductor layer to the n type are made to have the concentration of $1 \times 10^{17}$ atoms/cm$^3$ to $1 \times 10^{19}$ atoms/cm$^3$ in the second impurity regions and the concentration of $1 \times 10^{16}$ atoms/cm$^3$ to $1 \times 10^{18}$ atoms/cm$^3$ in the third impurity regions. Here, in the third impurity regions 241 to 245, the concentration of the impurity elements which convert the semiconductor layer to the n type and is included at least in the parts which overlap the conductive layers 230a to 234a in the second form, varies. That is to say, the concentration of phosphorous (P) added to the third impurity regions 241 to 245 gradually becomes lower toward the inside from the edge of the conductive layer in the regions which overlap the conductive layers in the second form. This is because the concentration of phosphorous (P) which reaches into the semiconductor layer varies in accordance with the differences of the film thickness of the tapered parts.

Then, after removing the masks made of the resist, masks 251 to 253 made of resist is newly formed so that the third doping process is carried out as shown in FIG. 3C. Through this third doping process, the fourth impurity regions 254 to 259 are formed, in which impurity elements which convert the semiconductor layer to p-type are added to the portion to become the active layer of the p channel type TFTs. By using the conductive layers 231 and 234 in the second form as masks against impurity elements, impurity elements which convert the semiconductor layer into the p type are added so that the fourth impurity regions are formed in a self-aligning manner. In the present example the impurity regions 254 to 259 are formed with an ion doping method using diborane ($B_2H_6$). In this third doping process, the semiconductor layer forming the n channel type TFTs is covered with the masks 251 to 253 made of the resist. Though phosphorous is added in the impurity regions 254 to 259 in respectively different concentrations in the first doping process and the second doping process, the third doping process is carried out so that the concentration of the impurity elements, which convert the semiconductor layer to the p type, becomes $2 \times 10^{20}$ atoms/cm$^3$ to $2 \times 10^{21}$ atoms/cm$^3$ in any of the regions, and there is no problem to function as source and drain regions of the p channel type TFTs.

With the above described processes, impurity regions are formed in respective semiconductor layers. The conductive layers 230 to 234 in the second form, which overlaps the semiconductor layer, function as gate electrodes. In addition, 235 functions as a source wiring while 234 functions as the second electrode for forming a capacitance which holds a charge.

Next, the masks 251 to 253 made of the resist are removed and the first interlayer insulating film 260, which covers the entire surface, is formed. The first interlayer insulating film 260 is formed of an insulating film with the thickness of 100 nm to 200 nm, which includes silicon, by using a plasma CVD method or a sputtering method. In the present example, a silicon oxide nitride film with the film thickness of 150 nm is formed through a plasma CVD method. The first interlayer insulating film 260 is not, of course, limited to a silicon oxide nitride film and, a single layer of, or a laminate structure of another insulating film which includes silicon, may be used.

Next, as shown in FIG. 4A, an activation process of impurity elements which are added to the respective semiconductor layers is carried out. This activation step is carried out through a thermal annealing method with an annealing furnace. The thermal annealing method is carried out at 400° C. to 700° C., preferably at 500° C. to 550° C. in a nitrogen atmosphere wherein the oxygen concentration is 1 ppm, or less, preferably 0.1 ppm, or less. Here, in addition to the thermal annealing method, a laser annealing method or a rapid thermal annealing method (RTA method) can be applied.

In addition, before the formation of the first interlayer insulating film 260, the activation process may be carried out. However, in the case that the materials of the wirings used for 230 to 235 are easily affected by heat, it is preferable to carry out the activation process after the formation of an interlayer insulating film (an insulating film in which the main component is silicon, for example, a silicon nitride film) in order to protect the wirings, or the like, as in the present example.

In addition, the step of hydrogenating the semiconductor layer is carried out in an atmosphere including 3% to 100% of hydrogen with heat processing of 1 hour to 12 hours at 300° C. to 550° C. This step is the step of terminating the dangling bonds of the semiconductor layer with thermally excited hydrogen. As for another means for hydrogenation, a plasma hydrogenation (using hydrogen excited by plasma) may be carried out.

In addition, in the case that a laser annealing method is used for the activation process, it is preferable to irradiate laser light such an excimer laser or from a YAG laser, after carrying out the above described hydrogenation.

Next, the second interlayer insulating film 261, made of an organic insulating material, is formed on the first interlayer insulating film 260. Next, patterning is carried out for forming a contact hole which reaches to the source wiring 235 and contact holes which reach to the respective impurity regions 246, 248, 249, 254 and 257.

Then, in the driving circuit 406, wirings 262 to 267 are formed to be electrically connected to the first impurity regions or to the fourth impurity regions, respectively. Here, these wirings are formed by patterning a lamination film of a Ti film with the film thickness of 50 nm and an alloy film (alloy film of Al and Ti) with the film thickness of 500 nm.

In addition, in the pixel part 407, a pixel electrode 270, a gate wiring 269 and a connection electrode 268 are formed (FIG. 4B). This connection electrode 268 forms an electric connection of the source wiring 235 to the pixel TFT 404. In addition, the gate wiring 269 forms an electric connection with the first electrode (conductive layer 233 in the second form). In addition, the pixel electrode 270 forms an electric connection with the drain region of a pixel TFT and, moreover, forms an electric connection with a semiconductor layer which functions as one electrode of a capacitance. In addition, as the pixel electrode 270, it is preferable to use a material with an excellent reflectivity such as a film including Al or Ag as the major component, or a lamination film composed of such films.

As the above, the driving circuit 406 which comprises an n channel type TFT 401, a p channel type TFT 402 and an n channel TFT 403, and a pixel portion 407 which comprises a pixel TFT and a capacitance 405 can be formed on the same substrate. In the present specification, such a substrate is referred to, for the purpose of convenience, as an active matrix substrate.

The n channel type TFT 401 in the driving circuit 406 contains a channel formation region 271; the third impurity region 241 (GOLD region) which overlaps the conductive layer 230 in the second form, which forms a gate electrode; the second impurity region 236 (LDD region) which is formed outside of the gate electrode; and the first impurity region 246 which functions as a source region or a drain region. The p channel type TFT 402 contains a channel formation region 272; the fourth impurity region 256 which overlaps the conductive layer 231 in the second form, which forms a gate electrode; the fourth impurity region 255 which is formed outside of the gate electrode; and the fourth impurity region 254 which functions as a source region or a drain region. The n channel type TFT 403 contains the channel formation region 273; the third impurity region 243 (GOLD region) which overlaps the conductive layer 232 in the second form, which forms a gate electrode;, the second impurity region 238 (LDD region) which is formed outside of the gate electrode; and the first impurity region 248 which functions as a source or drain region.

The pixel TFT 404 in the pixel part contains the channel formation region 274; the third impurity region 244 (GOLD region) which overlaps the conductive layer 233 in the second form, which forms a gate electrode; the second impurity region 239 (LDD region) which is formed outside of the gate electrode; and the first impurity region 249 which functions as a source region or as a drain region. In addition, in the semiconductor layer 257 to 259 which functions as one of the electrodes of the capacitance 405, impurity elements which convert the semiconductor layer into the p type are added with the same concentration as that of the fourth impurity regions. The capacitance 405 is formed of the second electrode 234 and the semiconductor layer 257 to 259 with the insulating film (same film as the gate insulating film) as the dielectric.

Figure 5:
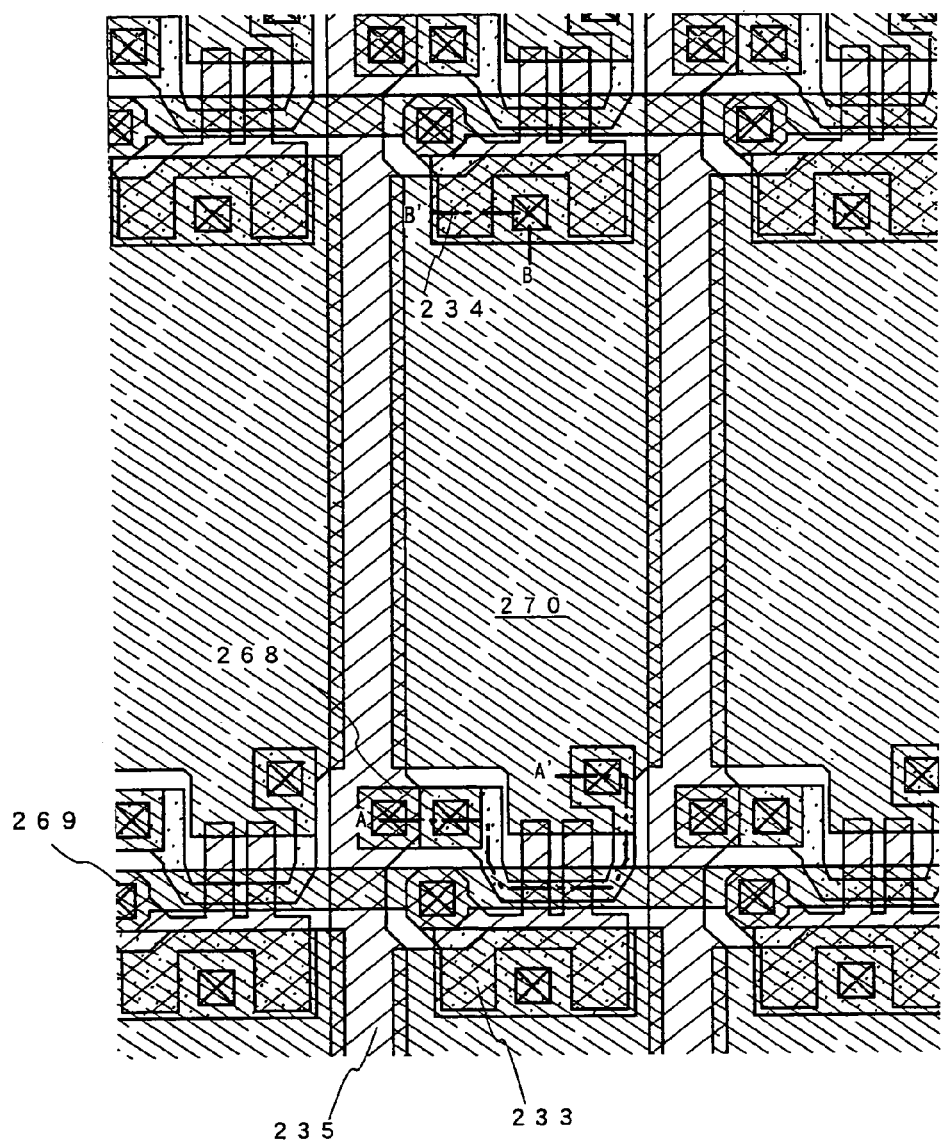
FIG. 5 is a top view of a pixel part of an active matrix substrate processed in the example 1.

A top view of the pixel portion of the active matrix substrate produced in the present example is shown in FIG. 5. Here, the parts corresponding to those in FIGS. 2 to 6 are referred to by the same numerals. The chain line A–A' in FIG. 4 corresponds to the cross section view along the chain line A–A' in FIG. 5. In addition, the chain line B–B' in FIG. 4 corresponds to a cross section view along the chain line B–B' in FIG. 5.

Thus, the active matrix substrate with a pixel structure of the present example is characterized in that the first electrode 233, which partially functions as a gate electrode, and the gate wiring 269 are formed in different layers and the gate wiring 269 blocks light from reaching the semiconductor layer.

In addition, the pixel structure of the present example is formed and arranged so that an edge part of a pixel electrode overlaps the source wiring in order to block light from reaching a gap between the pixel electrodes without using a black matrix.

In addition, it is preferable to increase the whiteness by making the surface of the pixel electrodes in the present example uneven through a known method, for example, through a sand blast method or through an etching method, so as to prevent a mirror reflection and to scatter the reflected light.

By introducing the above described pixel structure, pixel electrodes which have large areas can be arranged so that the aperture ratio can be increased.

In addition, in accordance with the steps shown in the present example, the number of photo masks, which is necessary for manufacturing the active matrix substrate, can be made to be 5 (the pattern mask for the semiconductor layer, the pattern mask for the first wiring (including the first electrode 233, the second electrode 234 and the source wiring 235), the pattern mask for forming the source region and the drain region of the p type TFT, the pattern mask for forming the contact holes and the pattern mask for the second wiring (including the pixel electrode 270, the connection electrode 268 and the gate wiring 269)). As a result, the process can be shortened, which can contribute to the reduction of the manufacturing cost and to the increase of the yield.

Figure 6:
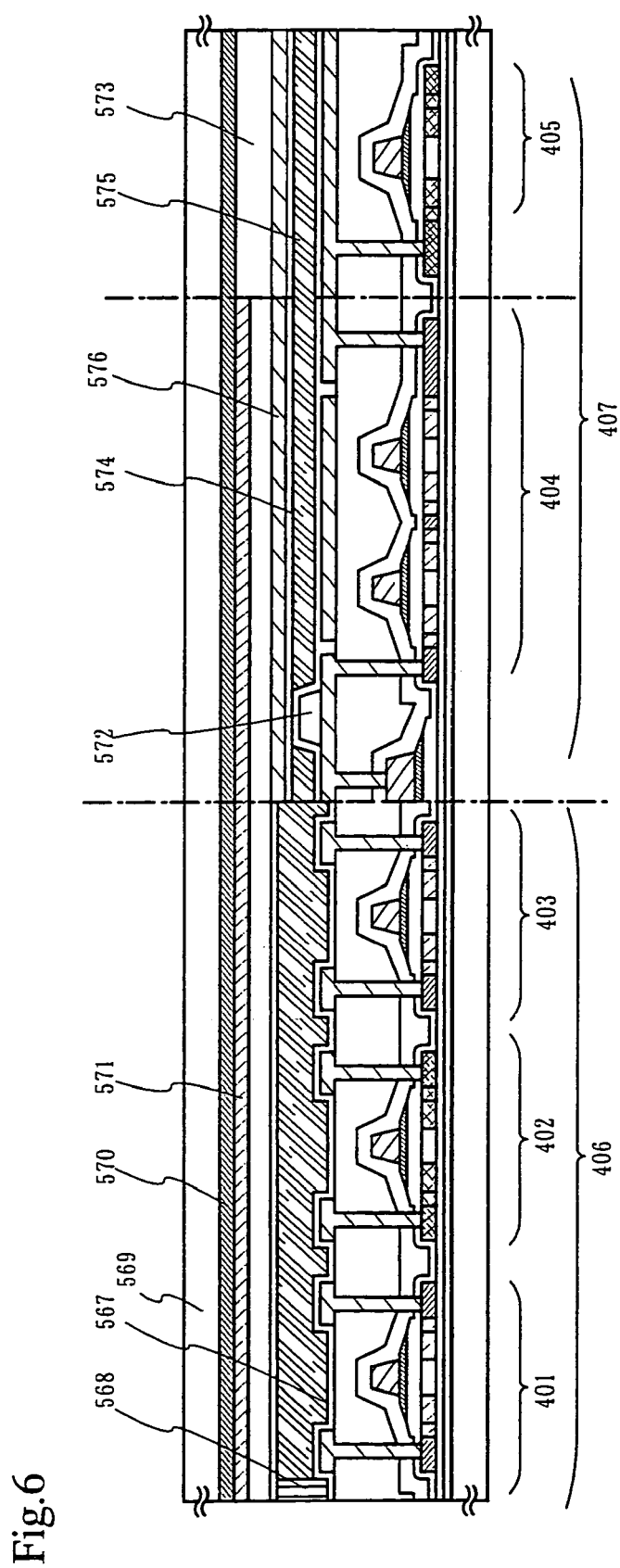
FIG. 6 is a cross section view of a TFT according to the example 1.

An active matrix liquid crystal display device manufactured from the active matrix substrate shown in FIG. 4B is shown in FIG. 6. After a pillar-shaped spacer 572 of organic resin such as acryl resin is formed, an orientation film 567 is formed on the active matrix substrate and rubbing is performed. A spherical spacer may be used instead of the pillar-shaped spacer 572.

Next, An opposing substrate is prepared. Coloring layers 570 and 571, which may be a red coloring layer and a blue coloring layer respectively, a leveling film 573, and an opposing electrode 576 are formed in order on the opposing substrate 569, and then an orientation film 574 is formed over the entire surface of the opposing electrode followed by rubbing.

Then, the active matrix substrate and the opposing substrate are bonded with a sealing material 568. A filler is mixed into the sealing material 568, and the filler and pillar-shaped spacer 572 make the interval of two substrates keep uniform. A known material is used as liquid crystal 575.

Example 2

In the case that the sequential process of forming the base film 201 and the amorphous semiconductor film is not carried out in the example 1, the present invention can be used.

In accordance with the same manner as in the example 1, the base film 201 is formed. Next, a sequential process of removal of contaminant impurities which exist on the surface of the base film 201 and formation of an amorphous semiconductor film is carried out. The method for removing the contaminant impurities on the surface of the base film and the process following the formation of the amorphous may be carried out in the same manner as in the example 1.

Example 3

Figure 7A:
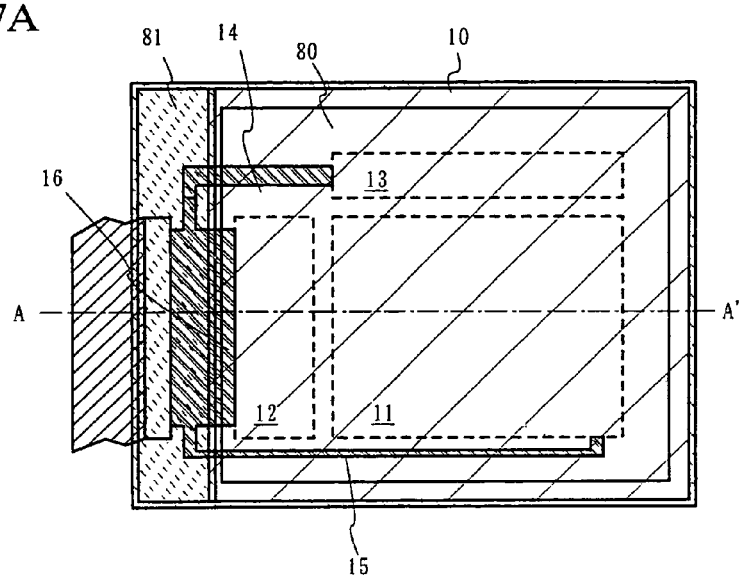
FIGS. 7A and 7B are a top view a cross sectional view of an EL display according to the example 3.

In Example 3, an example in which an EL(Electro Luminescence) display device is manufactured by using an active matrix substrate formed in Examples 1 and 2, will be described. The EL display device is also called a light emitting device or a light emitting diode, and a luminescent material put between electrodes, by which EL (Electro Luminescence) can be obtained, includes all of materials which emit light (phosphorescence and/or fluorescence) through singlet excitation, triplet excitation, or both. FIG. 7A is a top view of the EL display panel. In FIG. 7A, reference numeral 10 denotes a substrate, 11 denotes a pixel portion, 12 denotes a source-side driving circuit, and 13 denotes a gate-side driving circuit. Each driving circuit is connected to an FPC 17 through wirings 14 to 16 so as to be connected to an external equipment.

Figure 7B:
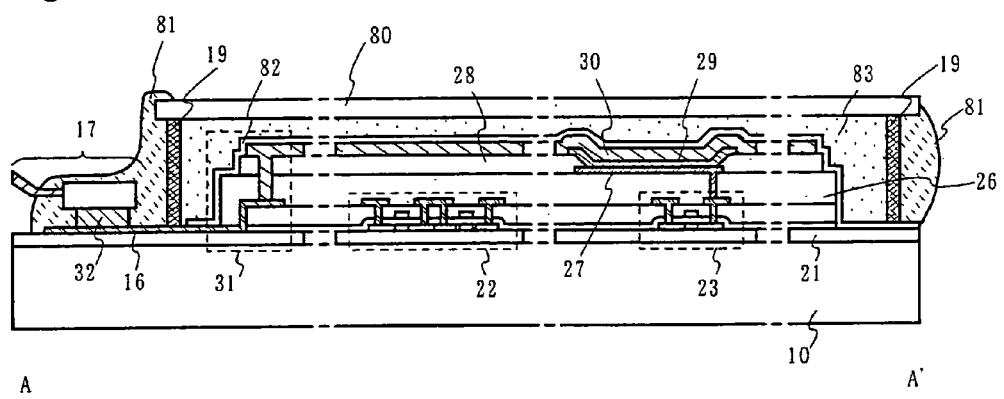

FIG. 7B shows a cross sectional view taken along the line A–A' of FIG. 7A. The counter substrate 80 is provided at least on the pixel portion, preferably on the driving circuits and the pixel portion. The counter substrate 80 is attached to the active matrix substrate, on which TFTs and a self-emitting layer using an EL material are formed with a sealing material 19. The sealing material 19 is mixed with a filler (not shown in the figure), two substrates are attached together with the filler at equal spaces. Further, the outside of the sealing material 19 and the top surface and the periphery of the FPC 17 have a structure of being filled up by a sealant 81. As a material of the sealant 81, silicone resin, epoxy resin, phenol resin and butyl rubber are used.

As it is, the active matrix substrate 10 and the counter substrate 80 are attached together with the sealing material 19, space is generated therebetween. A filler 83 is filled with the space. The filler 83 has an effect of attachment of the counter substrate 80. The PVC (polyvinyl chloride), epoxy resin, silicone resin, or EVA (ethylene vinyl acetate) can be used as the filler 83. The self-emitting layer is weak to moisture such as water and is likely to be degraded, so that it is preferable to mix a drying agent such as barium oxide in the filler 83 so as to keep an effect of moisture absorption. Further, a passivation film 82 is formed on the self-emitting layer by the silicon nitride film and silicon oxynitride film to protect from corrosion by alkali element or the like which contains in the filler 83.

In FIG. 7B, a driving circuit TFT 22 (CMOS circuit which is composed of n-channel type TFT and p-channel type TFT is shown here), and a pixel portion TFT 23 (only a TFT for controlling a current flown to an EL element is shown here) are formed on a substrate 10 and a base film 21.

To manufacture the EL display device from an active matrix substrate formed in the examples 1 and 2, an interlayer insulating film (a flattening film) 26 made of a resin material, is formed on the source wiring and the drain wiring, and a pixel electrode 27 made of a transparent conductive film, which is connected electrically to drain of the pixel portion TFT 23, is formed thereon. As a transparent conductive film, a compound of indium oxide and tin oxide (which is called as ITO), and a compound of indium oxide and zinc oxide can be used. After forming the pixel electrode 27, an insulating film 28 is formed, and an opening portion is formed on the pixel electrode 27.

Next, a self-emitting layer 29 is formed. The self-emitting layer 29 may have a lamination structure which is obtained by freely combination with layers made of known EL materials (hole injection layer, hole transporting layer, light-emitting layer, electron transportation layer, or electron injection layer) or a single structure. Such a structure can be obtained by a known technique. Furthermore, examples of the EL material include a low molecular-weight material and polymer material. In the case of using a low molecular-weight material, vapor deposition is used. In the case of using a polymer material, a simple method such as spin coating, printing, and an ink jet method can be used.

The self-emitting layer is formed by vapor deposition, ink jet method or dispenser method using a shadow mask. In any way, by forming light-emitting layers (red light-emitting layer, green-light emitting layer, and blue light-emitting layer) capable of emitting light with different wavelengths on respective pixels, a color display can be performed. In addition, a combination of a color conversion layer (CCM) and a color filter, or a combination of a white light-emitting layer and a color filter may be used. Needless to say, an EL display device emitting single color light can also be used.

When the self-emitting layer 29 is formed, a cathode 30 is formed thereon. It is desirable to remove moisture and oxygen present at an interface between the cathode 30 and the self-emitting layer 29 as much as possible. Thus, it is required to continuously form the self-emitting layer 29 and the cathode 30 in a vacuum, or to form the self-emitting layer 29 in an inactive atmosphere, and form the cathode 30 in a vacuum without exposing to the outside air. In the present example, a film formation device of a multi-chamber system (cluster tool system) is used to make the above mentioned film formation possible.

The cathode 30 is connected to the wiring 16 in a region denoted by reference numeral 31. The wiring 16 is a power supply line for supplying a predetermined voltage to the cathode 30, and is connected to the FPC 17 via anisotropic conductive paste material 32. The sealant 81 is further formed on the FPC 17 so as to enhance adhesiveness in this portion.

To electrically connect the cathode 30 with the wiring 16 in the region 31, it is required to form contact holes in the interlayer insulating film 26 and the insulating film 28. The contact holes may be formed during etching of the interlayer insulating film 26 (during formation of a contact hole for a pixel electrode) or during etching of the insulating film 28 (during formation of an opening portion before forming the self-emitting layer). Furthermore, when the insulating film 28 is etched, the interlayer insulating film 26 may also be etched together. In this case, if the interlayer insulating film 26 and the insulating film 28 are made of the same resin material, the shape of the contact holes can be made fine.

Furthermore, the wiring 16 is electrically connected to the FPC 17 through a gap between the sealing material 19 and the substrate 10 (the gap is filled with a sealant 81). Herein, although description is made with respect to the wiring 16, other wirings 14 and 15 are also electrically connected to the FPC 17 under the sealing material 19.

Figures 8A, 8B:
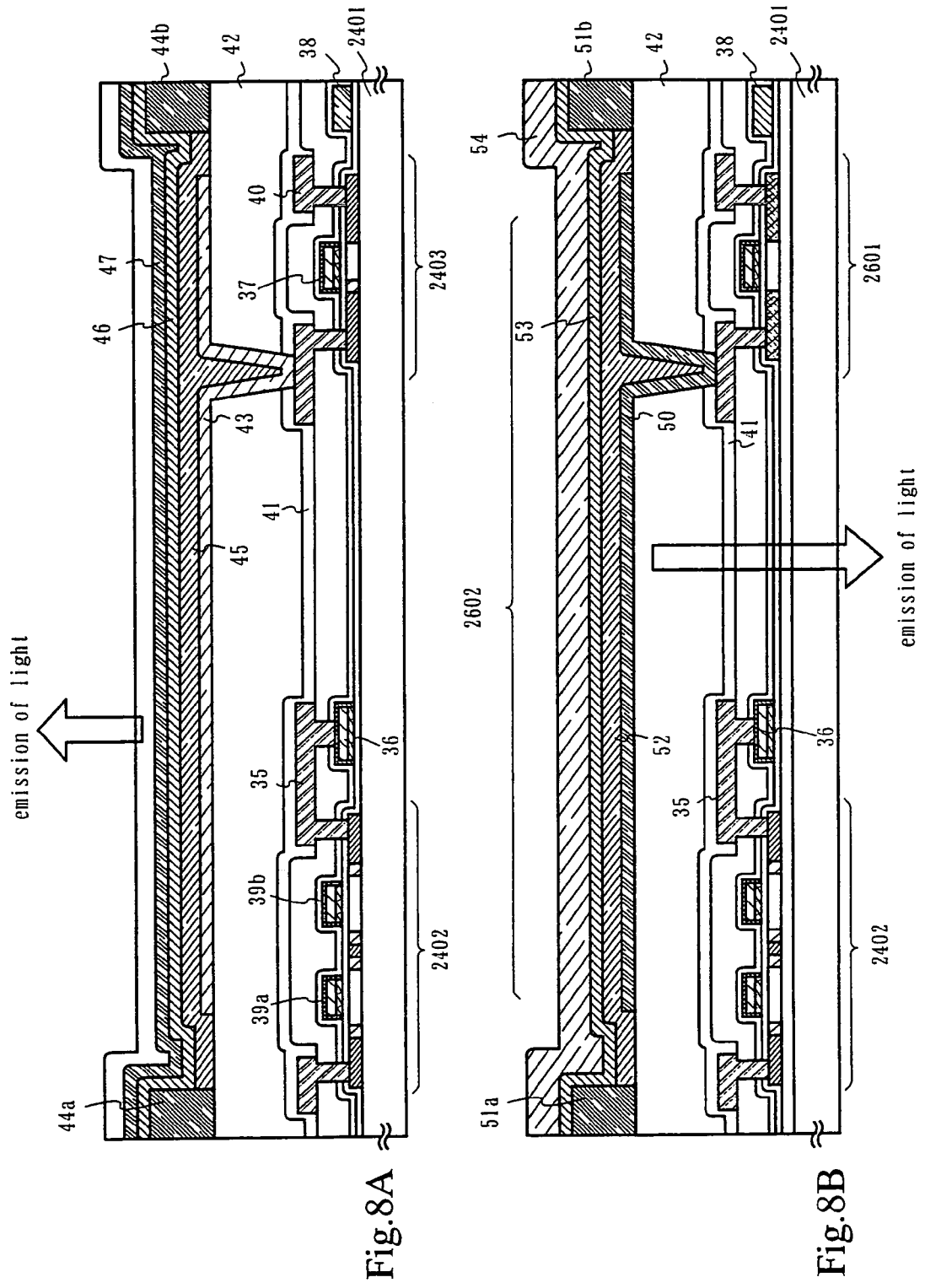
FIGS. 8A and 8B are cross sectional views of an EL display panel according to the example 3.
Figure 9:
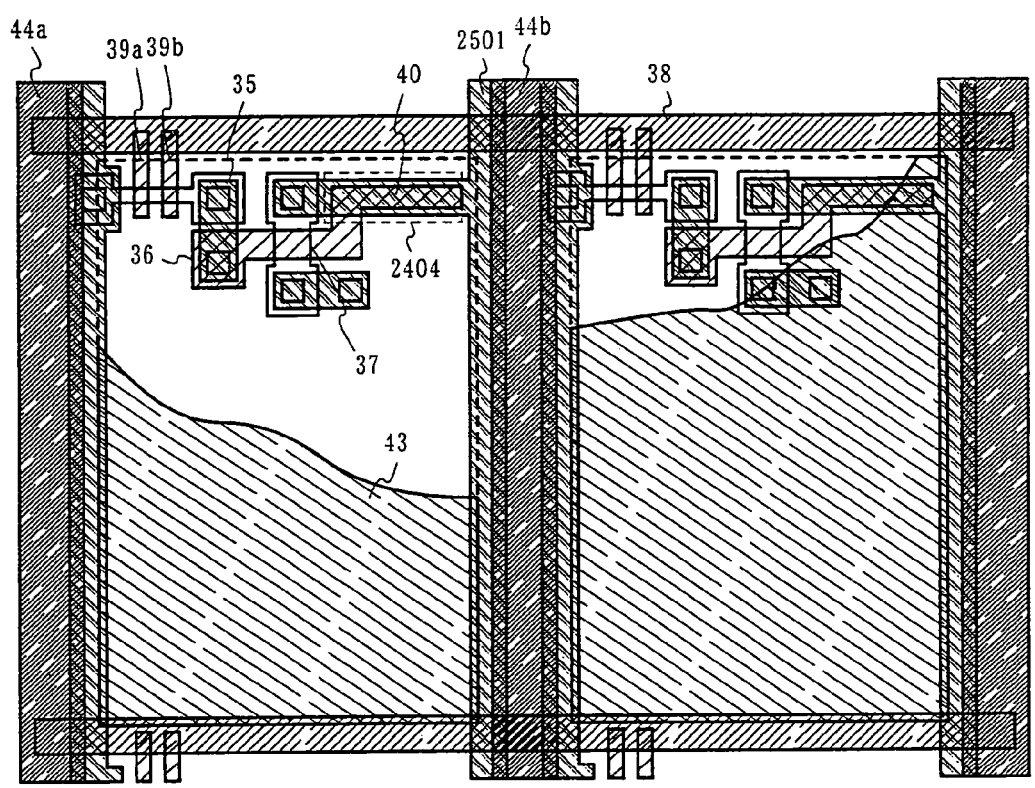
FIG. 9 is a top view of an EL display panel according to the example 3.

FIG. 8 shows a more detailed cross-sectional structure of the pixel portion and FIG. 9 shows a top view thereof. In FIG. 8A, a switching TFT 2402 provided on a substrate 2401 is formed as the pixel TFT 404 shown in FIG. 4B of the example 1. In the present example, the TFT has a double-gate structure, however, it may have a triple gate structure, or a multi-gate structure having more gates.

Further, the current controlling TFT 2403 has a structure in which an LDD overlapping with a gate electrode is provided at only drain side, and the structure has an ability of driving a current by reducing a parasitic capacitance and series resistance between a gate and drain. Further, since the current controlling TFT is an element for controlling the amount of a current flowing through an EL element, the current controlling TFT is likely to be degraded by heat and hot carriers due to a large amount of current flowed therethrough. Therefore, an LDD region overlapping partly with a gate electrode, is provided on the current controlling TFT, thereby preventing the deterioration of TFT and enhancing the stability of the operation. At this time, a drain wiring 35 of the switching TFT 2402 is electrically connected to the gate electrode 37 of the current controlling TFT through the wiring 36. Further, the wiring denoted by a reference numeral 38 is a gate wiring for connecting the gate electrodes 39a and 39b of the switching TFT 2402.

Furthermore, in the present example, the current controlling TFT 2402 has a single gate structure. However, it may have a multi-gate structure in which a plurality of TFTs are connected in series. Furthermore, it may also be possible that a plurality of TFTs are connected in parallel to substantially divide a channel formation region into a plurality of parts, so as to conduct highly efficient heat release. Such a structure is effective for preventing degradation due to heat.

As shown in FIG. 9, a wiring to be the gate electrode 37 of the current controlling TFT 2403 overlaps a source wiring 40 of the current controlling TFT 2403 via an insulating film in a region 2404. In the region 2404, a capacitor is formed. The capacitor 2404 functions for holding a voltage applied to a gate of the current controlling TFT 2403. The source wiring 40 is connected to a current supply line (power source line) 2501 so as to be always supplied with a constant voltage.

A first passivation film 41 is provided on the switching TFT 2402 and the current controlling TFT 2403, and a flattening film 42 that is made of a resin insulating film is formed thereon. It is very important to flatten the step difference due to TFTs by using the flattening film 42. The step difference may cause a light-emitting defect because the self-emitting layer to be formed later is very thin.

Reference numeral 43 denotes a pixel electrode (cathode of an EL element) that is made of a conductive film with high reflectivity and is electrically connected to the drain of the current controlling TFT 2403. As the pixel electrode 43, a low resistant conductive film such as an aluminum alloy film, a copper alloy film, and a silver alloy film, or a lamination film thereof can be preferably used. Needless to say, a lamination structure with other conductive films may also be used. A light-emitting layer 45 is formed in a groove (corresponding to a pixel) formed by banks 44a and 44b made of an insulating film (preferably resin). Herein, only one pixel is shown, however, light-emitting layers corresponding to each color R (red), G (green), and B (blue) may be formed. As an organic EL material for the light-emitting layer, a π-conjugate polymer material such as polyparaphenylene vinylene (PPV), polyvinyl carbazole (PVK), and polyfluorene is used.

In the present example, a self-emitting layer with a lamination structure is used, in which a hole injection layer 46 made of PEDOT (polythiophene) or PAni (polyaniline) is provided on the light-emitting layer 45. An anode 47 made of a transparent conductive film is provided on the hole injection layer 46. In the present example, light generated by the light-emitting layer 45 is irradiated to the upper surface (toward the upper of TFTs), so that the anode must be transparent to light. As a transparent conductive film, a compound of indium oxide and tin oxide, and a compound of indium oxide and zinc oxide can be used. The conductive film is formed after forming the light-emitting layer and the hole injection layer with low heat resistance, so that the conductive film that can be formed at a possibly low temperature is preferably used.

In the present example, referring to FIG. 8B, the case will be described where the structure of the self-emitting layer is reversed. The current control TFT 2601 is formed as a p-channel type TFT 402 of FIG. 4. The manufacturing process is referred to the example 1. In the present example, a transparent conductive film is used as a pixel electrode (anode) 50.

After banks 51a and 51b made of an insulating film are formed, a light-emitting layer 52 made of polyvinyl carbazole is formed by coating of a solution. On the light-emitting layer 52, an electron injection layer 53 made of potassium acetyl acetonate (acacK), and a cathode 54 made of an aluminum alloy are formed. In this case, the cathode 54 functions as a passivation film. Thus, an EL element 2602 is formed. In the present example, light generated by the light-emitting layer 53 is irradiated toward the substrate on which a TFT is formed as represented by an arrow. In the case of the structure of the present example, it is preferable that the current controlling TFT 2601 is formed of a p-channel TFT.

Example 4

A TFT formed by implementing the present invention is utilized for various display devices (typically, active matrix liquid crystal display). Namely, the present invention can be applied to all of electronic equipments incorporating the electro-optical device or a semiconductor circuit as components The following can be given as examples of such electronic equipments: a video camera; a digital camera; a projector (rear type or front type); a head mounted display (a goggle type display); a car navigation system; a car audio system; a personal computer; a portable information terminal (such as a mobile computer, a mobile telephone, or an electronic book). Examples of those electronic equipments are shown in FIGS. 10, 11 and 12.

Figure 10A:
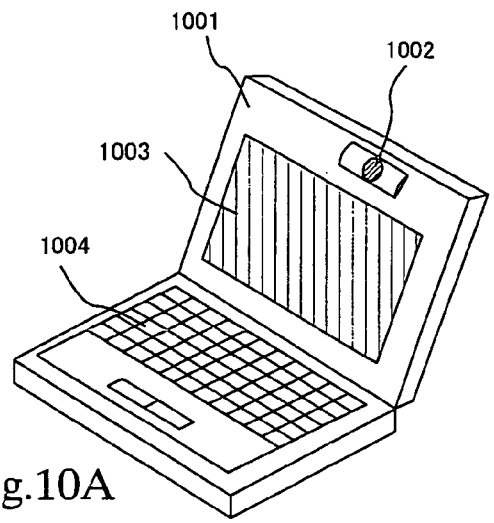
FIGS. 10A, 10B, 10C, 10D, 10E and 10F are views showing a variety of semiconductor devices according to the example 4.

FIG. 10A illustrates a personal computer which includes a main body 1001, an image input portion 1002, a display portion 1003, a key board 1004, or the like. The present invention can be applied to the image input portion 1002, the display portion 1003, and other signal controlling circuits.

Figure 10B:
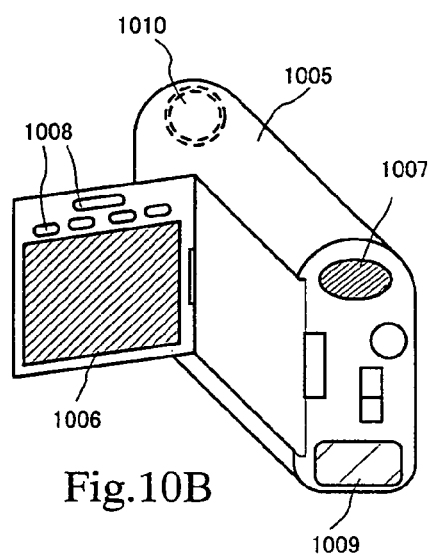

FIG. 10B illustrates a video camera which includes a main body 1005, a display portion 1006, an audio input portion 1007, operation switches 1008, a battery 1009, an image receiving portion 1010, or the like. The present invention can be applied to the display portion 1006, and other signal controlling circuits.

Figure 10C:
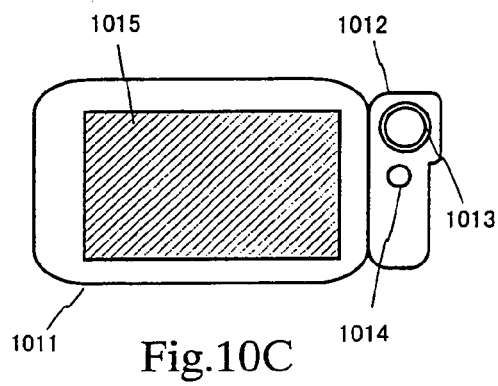

FIG. 10C illustrates a mobile computer which includes a main body 1011, a camera section 1012, an image receiving section 1013, operation switches 1014, a display portion 1015, or the like. The present invention can be applied to the display portion 1015, and other signal controlling circuits.

Figure 10D:
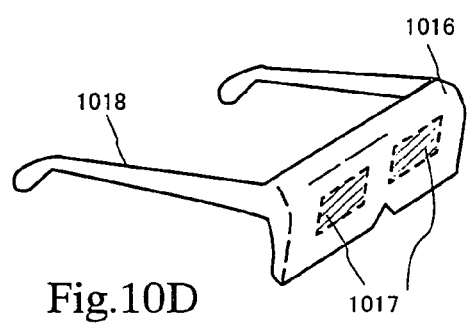

FIG. 10D illustrates a goggle type display which includes a main body 1016, a display portion 1017, and an arm section 1018. The present invention can be applied to the display portion 1017, and other signal controlling circuits.

Figure 10E:
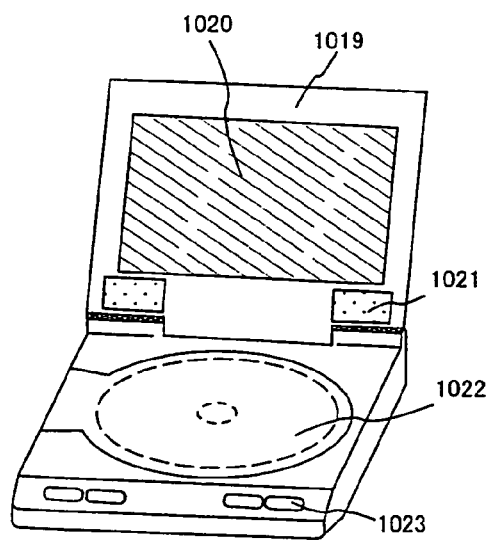

FIG. 10E illustrates a player using a recording medium which records a program (hereinafter referred to as a recording medium) and includes a main body 1019, a display portion 1020, a speaker section 1021, a recording medium 1022, and operation switches 1023. This player uses DVD (digital versatile disc), CD, etc. for the recording medium, and can be used for music appreciation, film appreciation, games and Internet. The present invention can be applied to the display portion 1020 and other signal controlling circuits.

Figure 10F:
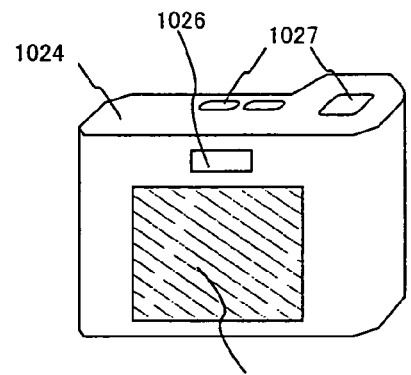

FIG. 10F illustrates a digital camera which includes a main body 1024, a display portion 1025, a view finder portion 1026, operation switches 1027, and an image receiving section (not shown in the figure). The present invention can be applied to the display portion 1025 and other signal controlling circuits.

Figure 11A:
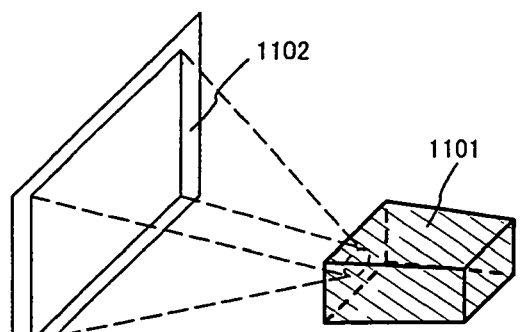
FIGS. 11A, 11B, 11C and 11D are views showing a variety of semiconductor devices according to the example 4.

FIG. 11A illustrates a front type projector which includes a projecting apparatus 1101 and a screen 1102. The present invention can be applied to a liquid crystal display device 1114 which structures a portion of the projecting apparatus 1101, and other signal controlling circuits.

Figure 11B:
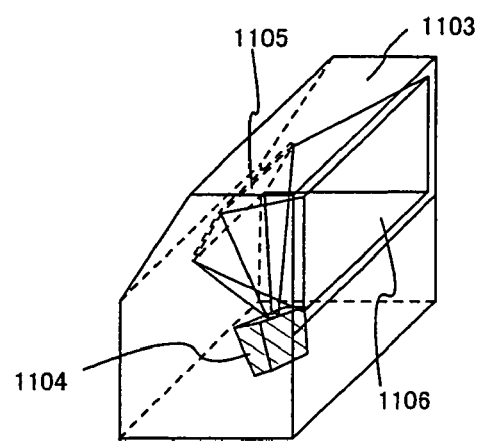

FIG. 11B illustrates a rear type projector which includes such a main body 1103, a projecting apparatus 1104, a mirror 1105, and a screen 1106. The present invention can be applied to the liquid crystal display device 1114 which structures a portion of the projecting apparatus 1104, and other signal controlling circuits.

Figure 11C:
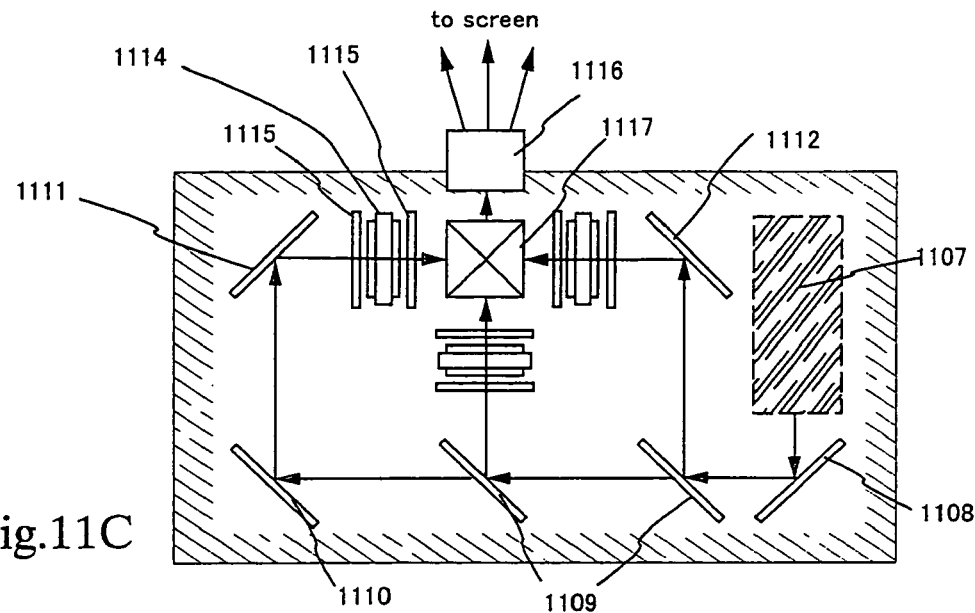

Note that an example of the structure of the projecting apparatuses 1101 and 1104 of FIG. 11A and FIG. 11B is shown in FIG. 11C. The projecting apparatuses 1101 and 1104 are composed of a light source optical system 1107, mirrors 1108 and 1110 to 1112, a dichroic mirror 1109, a prism 1117, the liquid crystal display device 1114, a phase difference plate 1115, and a projecting optical system 1116. The projecting optical system 1116 is composed of an optical system including a projection lens. A three-plate type example is shown in the example 4, but there are no particular limitations, and a single-plate type may also be used, for example. Further, optical systems such as an optical lens, a film having a light polarizing function, a film for regulating the phase, and an IR film may be suitably placed in the optical path shown by the arrow in FIG. 11C by an operator.

Figure 11D:
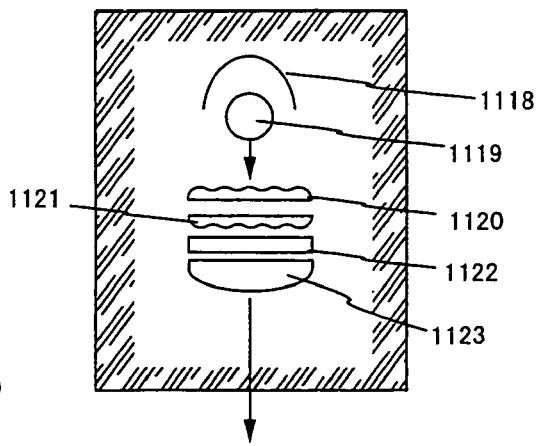

Further, FIG. 11D is a diagram showing one example of the light source optical system 1107 in FIG. 11C. In the example 4, the light source optical system 1107 is composed of a reflector 1118, a light source 1119, lens arrays 1120 and 1121, a polarizing transformation element 1122, and a condenser lens 1123. Note that the light source optical system shown in FIG. 11D is one example, and the light source optical system is not limited to the structure shown in the figure. For example, optical systems such as an optical lens, a film having a light polarizing function, a film for regulating the phase, and an IR film may be suitably added by the operator.

Note that a case using a transmitting type display device in the projectors shown in FIG. 11 is shown here, and an example of applying a reflecting type display device is not shown in the figures.

Figure 12A:
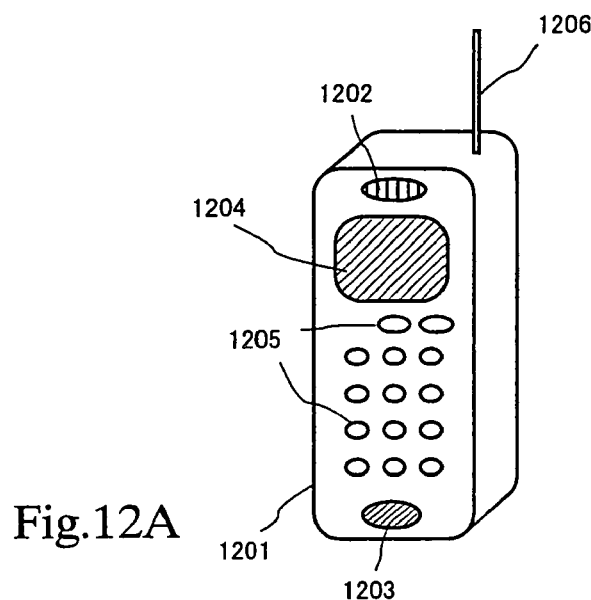
FIGS. 12A, 12B and 12C are views showing a variety of semiconductor devices according to the example 4.

FIG. 12A illustrates a portable telephone, which includes a main body 1201, an audio output portion 1202, an audio input portion 1203, a display portion 1204, operation switches 1205, and an antenna 1206. The present invention can be applied to the audio output portion 1202, the audio input portion 1203, the display portion 1204, and other signal controlling circuits.

Figure 12B:
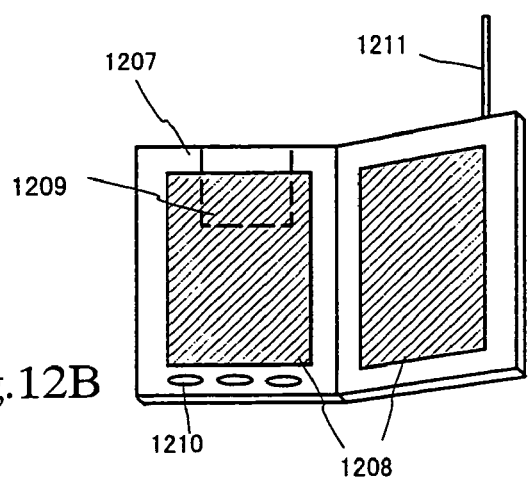

FIG. 12B illustrates a portable book (electronic book) which includes a main body 1207, a display portion 1208, a recording medium 1209, operation switches 1210, and an antenna 1211. The present invention can be applied to the display portions 1208, the recording medium 1209, and other signal controlling circuits.

Figure 12C:
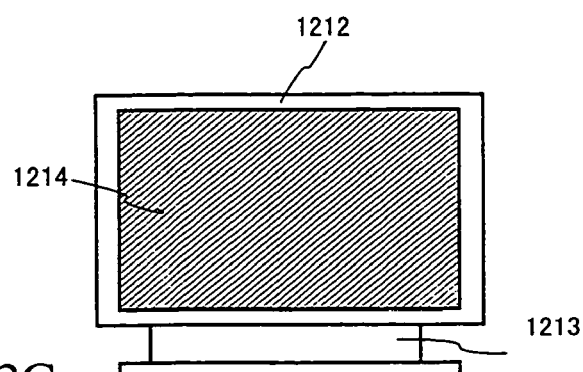

FIG. 12C illustrates a display, which includes a main body 1212, a support stand 1213, and a display portion 1214. The present invention can be applied to the display portion 1214. The display of the present invention is advantageous for cases of large size screens in particular, and is advantageous for displays having a diagonal equal to or greater than 10 inches (in particular, equal to or greater than 30 inches).

The applicable scope of the present invention is thus extremely wide, so that the present invention can be applied to electronic equipments in all fields.

What is claimed is:

1. A method for manufacturing a light emitting device comprising the steps of:

forming a base insulating film over a substrate:

forming an oxide film on a surface of the base insulating film by applying water in which ozone is dissolved;

etching the base insulating film to remove the oxide film and contaminant impurities on the surface of the base insulating film by applying an etching solution while spinning the substrate;

forming a thin film transistor over the base insulating film;

forming an insulating film over the thin film transistor;

forming an anode over the insulating film;

forming a light emitting layer over the anode in an inactive gas atmosphere; and forming a cathode over the light emitting layer without breaking vacuum.

2. A method according to claim 1, wherein the light emitting layer comprises at least one of a low-molecular weight material and a polymer material.

3. A method according to claim 1, wherein the light emitting layer and the cathode are formed by a multi-chamber system.

4. A method according to claim 1, wherein the light emitting device is incorporated into an electronic equipment selected from the group consisting of a video camera, a digital camera, a projector, a head mounted display, a navigation system, an audio system, a personal computer, and a portable information terminal.

5. A method for manufacturing a light emitting device comprising the steps of:
   forming a semiconductor layer over a substrate;
   forming a gate insulating film over the semiconductor layer;
   forming an oxide film on the gate insulating film by applying water in which ozone is dissolved,
   removing the oxide film together with impurities on a surface of the gate insulating film;
   forming a gate electrode on the gate insulating film;
   forming an insulating film over the gate electrode;
   forming an anode over the insulating film;
   forming a light emitting layer over the anode by an ink jet method in an inactive gas atmosphere; and
   forming a cathode over the light emitting layer without breaking vacuum.

6. A method according to claim 5, wherein the light emitting layer comprises at least one of a low-molecular weight material and a polymer material.

7. A method according to claim 5, wherein the light emitting layer and the cathode are formed by a multi-chamber system.

8. A method according to claim 5, wherein the light emitting device is incorporated into an electronic equipment selected from the group consisting of a video camera, a digital camera, a projector, a head mounted display, a navigation system, an audio system, a personal computer, and a portable information terminal.

9. A method for manufacturing a light emitting device comprising the steps of:
   forming a semiconductor layer over a substrate;
   forming a gate insulating film over the semiconductor layer;
   forming an oxide film on the gate insulating film by applying water in which ozone is dissolved,
   removing the oxide film together with impurities on a surface of the gate insulating film;
   forming a gate electrode on the gate insulating film;
   forming an insulating film over the gate electrode;
   forming an anode over the insulating film;
   forming a light emitting layer over the anode in an inactive gas atmosphere; and
   forming a cathode over the light emitting layer without breaking vacuum.

10. A method according to claim 9, wherein the light emitting layer comprises at least one of a low-molecular weight material and a polymer material.

11. A method according to claim 9, wherein the light emitting layer and the cathode are formed by a multi-chamber system.

12. A method according to claim 9, wherein the light emitting device is incorporated into an electronic equipment selected from the group consisting of a video camera, a digital camera, a projector, a head mounted display, a navigation system, an audio system, a personal computer, and a portable information terminal.

13. A method for manufacturing a light emitting device comprising the steps of:
   forming a base insulating film over a substrate;
   forming an oxide film on a surface of the base insulating film by applying water in which ozone is dissolved;
   etching the base insulating film to remove the oxide film and contaminant impurities on the surface of the base insulating film by applying an etching solution while spinning the substrate;
   forming an insulating film over the gate electrode;
   forming an anode over the insulating film;
   forming a light emitting layer over the anode by an ink jet method in an inactive gas atmosphere; and
   forming a cathode over the light emitting layer without breaking vacuum.

14. A method according to claim 13, wherein the light emitting layer comprises at least one of a low-molecular weight material and a polymer material.

15. A method according to claim 13, wherein the light emitting layer and the cathode are formed by a multi-chamber system.

16. A method according to claim 13, wherein the light emitting device is incorporated into an electronic equipment selected from the group consisting of a video camera, a digital camera, a projector, a head mounted display, a navigation system, an audio system, a personal computer, and a portable information terminal.

* * * * *